United States Patent
Covarel et al.

(10) Patent No.: US 6,724,673 B2
(45) Date of Patent: Apr. 20, 2004

(54) MEMORY READING DEVICE

(75) Inventors: Hervé Covarel, Meylan (FR); Eric Compagne, Crolles (FR)

(73) Assignee: Dolphin Integration, Meylan (FR)

( * ) Notice: Subject to any disclaimer, the term of this patent is extended or adjusted under 35 U.S.C. 154(b) by 0 days.

(21) Appl. No.: 10/018,078

(22) PCT Filed: Apr. 9, 2001

(86) PCT No.: PCT/FR01/01077
§ 371 (c)(1),
(2), (4) Date: Mar. 15, 2002

(87) PCT Pub. No.: WO01/78078
PCT Pub. Date: Oct. 18, 2001

(65) Prior Publication Data
US 2003/0021160 A1 Jan. 30, 2003

(30) Foreign Application Priority Data
Apr. 10, 2000 (FR) .............................. 00 04589

(51) Int. Cl.⁷ .............................. G11C 7/00; G11C 7/02
(52) U.S. Cl. .................. 365/207; 365/203; 365/210
(58) Field of Search ................. 365/207, 203, 365/210, 185.2, 185.21

(56) References Cited

U.S. PATENT DOCUMENTS

| | | | |
|---|---|---|---|
| 4,622,655 A | 11/1986 | Suzuki | 365/149 |
| 4,669,065 A | 5/1987 | Ohsawa | 365/210 |
| 5,627,790 A * | 5/1997 | Golla et al. | 365/210 |
| 5,652,728 A * | 7/1997 | Hosotani et al. | 365/210 |
| 5,729,492 A * | 3/1998 | Campardo | 365/185.2 |
| 5,933,366 A * | 8/1999 | Yoshikawa | 365/185.2 |
| 6,018,481 A | 1/2000 | Shiratake | 365/190 |
| 6,370,060 B2 * | 4/2002 | Takata et al. | 365/185.2 |
| 6,404,666 B1 * | 6/2002 | Uchida | 365/210 |
| 6,535,434 B2 * | 3/2003 | Maayan et al. | 365/210 |
| 6,567,330 B2 * | 5/2003 | Fujita et al. | 365/210 |

FOREIGN PATENT DOCUMENTS

DE     199 28 598 A     12/1999

* cited by examiner

Primary Examiner—Trong Phan
(74) Attorney, Agent, or Firm—Duane Morris LLP

(57) ABSTRACT

The invention concerns a device for reading a storage cell (4), comprising a reading differential amplifier (18) having a first input terminal (16) connected to a column of cells (10) and a circuit (34) designed to feed to a second input terminal (20) of the amplifier (18) a reference voltage (Vref). The circuit (34) comprises means (38) for storing the voltage of said column and means (38, 40, 42) for applying as reference voltage (Vref) the stored voltage modified by a predetermined quantity.

8 Claims, 3 Drawing Sheets

MEMORY READING DEVICE

FIELD OF THE INVENTION

The present invention relates to a device for reading a memory and more specifically a read-only memory (ROM, PROM, EPROM, EEPROM).

BACKGROUND OF THE INVENTION

FIG. 1 schematically and partially shows a ROM 2 including a plurality of memory points arranged in rows or word lines and in columns or bit lines. Each memory point includes or not an active cell 4. The cells 4 are formed of transistors or any other switching circuit likely to connect to a low voltage, currently the ground, the column including this cell. The addressing of cells 4 is performed by rows or word lines WL 6 connected to a line decoder 8. When an active cell is addressed, it modifies the voltage of the column 10 to which it is connected. In the case of a simple ROM, some cells are made inactive by construction, generally by suppressing of one of their connections, and the corresponding memory point never connects the corresponding column to ground, whatever the corresponding row voltage. Each column 10 is connected to a high supply voltage Vdd via a precharge transistor 12 and is connected to a first input 16 of a sense amplifier 18. Groups of columns may be associated by multiplexers (not shown). A second input 20 of each sense amplifier 18 is connected to a reference voltage Vref.

To read a memory point, column 10 is brought to a precharge voltage Vpch which is substantially equal to supply voltage Vdd and a high signal is applied on one of rows WL. If the memory point is not programmed, column 10 substantially keeps the precharge voltage on its terminal 16. However, if the memory point is programmed, column 10 is discharged by a current I which flows through cell 4. The voltage on line 10 drops and sense amplifier 18 switches when the voltage on terminal 16 falls under reference voltage Vref on terminal 20. The switching time of amplifier 18 or read time is provided by the following relation:

$$T = C \cdot \Delta V / I$$

in which $\Delta V$ is potential difference Vpch-Vref between inputs 16 and 20 of sense amplifier 18, beyond which the switching of sense amplifier 18 occurs, C represents the capacitance of column 10 and I represents the value of the current flowing through cell 4.

The respective values of capacitance C and of current I can be considered as constant. Thus, to reduce read time T, voltage $\Delta V$ must be reduced, that is, a voltage Vref as close as possible to Vpch must be chosen. Now, it is necessary to provide a security margin to take technological drifts, voltage offsets at the inputs of amplifier 18, fluctuations of voltages Vdd and Vref, of low voltage Vss, and of the difference between Vdd and Vpch, into account.

A known solution to optimize the value of Vref consists of performing a differential reading by adding to memory 2 reference columns and by sampling a reference voltage on these reference columns. In practice, a relatively large number of reference columns must be provided, for example, one for eight real columns. This solution thus has the disadvantage of increasing the memory size and cost. Further, each reference column 21 introduces a stray capacitance.

SUMMARY OF THE INVENTION

An object of the present invention is to provide a method and a device for reading a ROM, overcoming the above disadvantages.

This object is achieved by means of a device for reading a cell of a memory, including a differential sense amplifier having a first input terminal connected to a cell column and a circuit intended to provide to a second input terminal of the amplifier a reference voltage. The above-mentioned circuit includes a means for storing the voltage of said column and a means for applying as a reference voltage the stored voltage modified by a predetermined amount.

According to an embodiment of the present invention, the presence of a cell translates as a reduction in the voltage of a column and the reference voltage is reduced by a predetermined amount with respect to the stored voltage.

According to an embodiment of the present invention, the above-mentioned circuit includes a first capacitive element intended to store the precharge voltage and a second capacitive element connectable in parallel on the first one to set the value of the reference voltage.

According to an embodiment of the present invention, the capacitive elements are formed of the gate-source, gate-substrate, and gate-drain capacitances of MOS transistors.

The present invention also aims at a method for reading a cell of a memory, including the steps of storing the voltage of a column just before reading; and modifying the stored voltage by a predetermined amount and using the modified voltage as a reference voltage.

According to an embodiment of the present invention, this reading method further consists of comparing the reference voltage with a column voltage.

According to an embodiment of the present invention, this reading method further consists of applying the precharge voltage on a first capacitor; disconnecting the first capacitor from the precharge voltage; and connecting in parallel on the first capacitor a second capacitor.

The foregoing objects, features and advantages of the present invention will be discussed in detail in the following non-limiting description of specific embodiments in connection with the accompanying drawings.

DETAILED DESCRIPTION OF THE INVENTION

Figure 1:
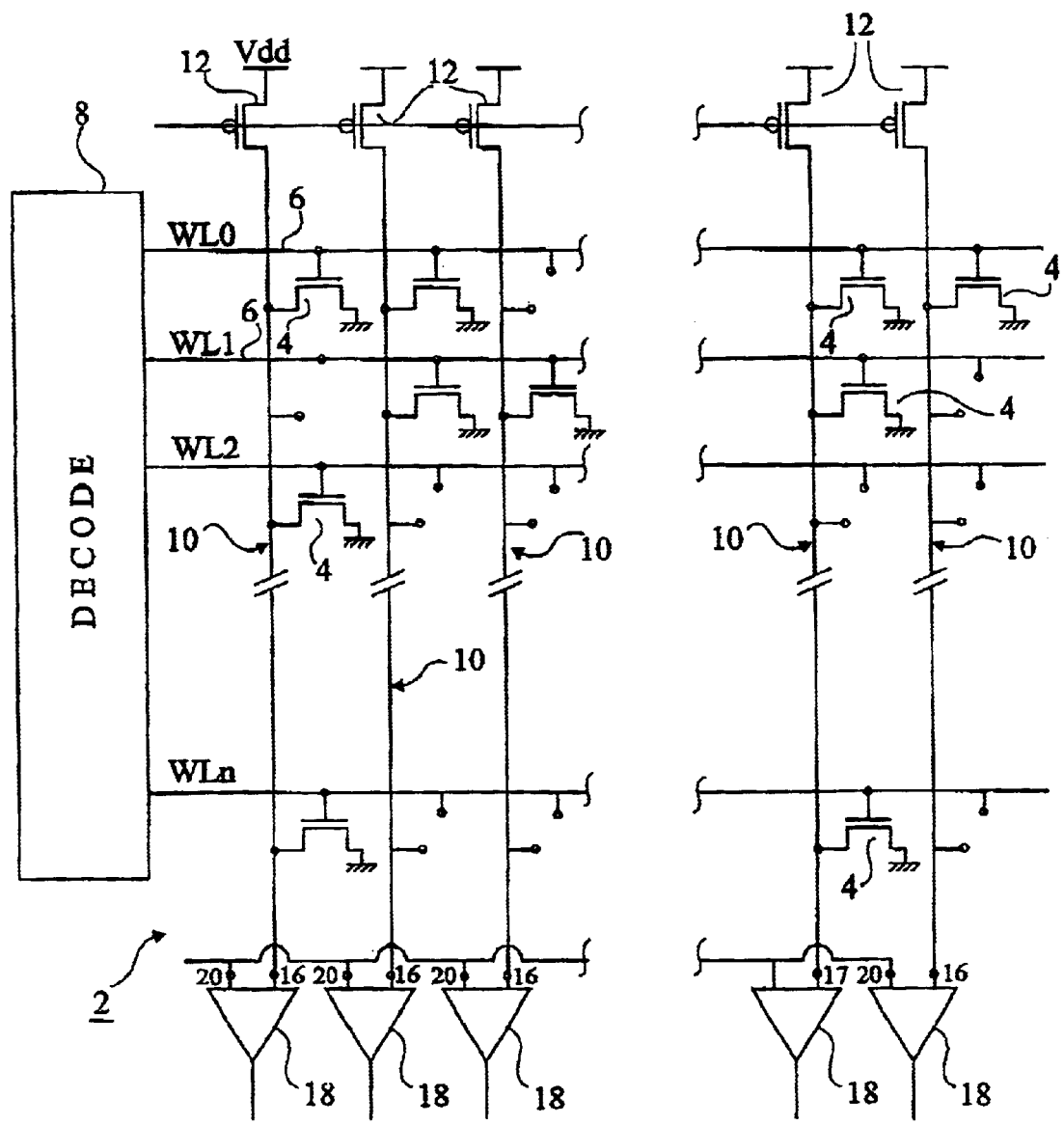
FIG. 1, previously described, schematically and partially shows a ROM according to prior art.
Figure 2:
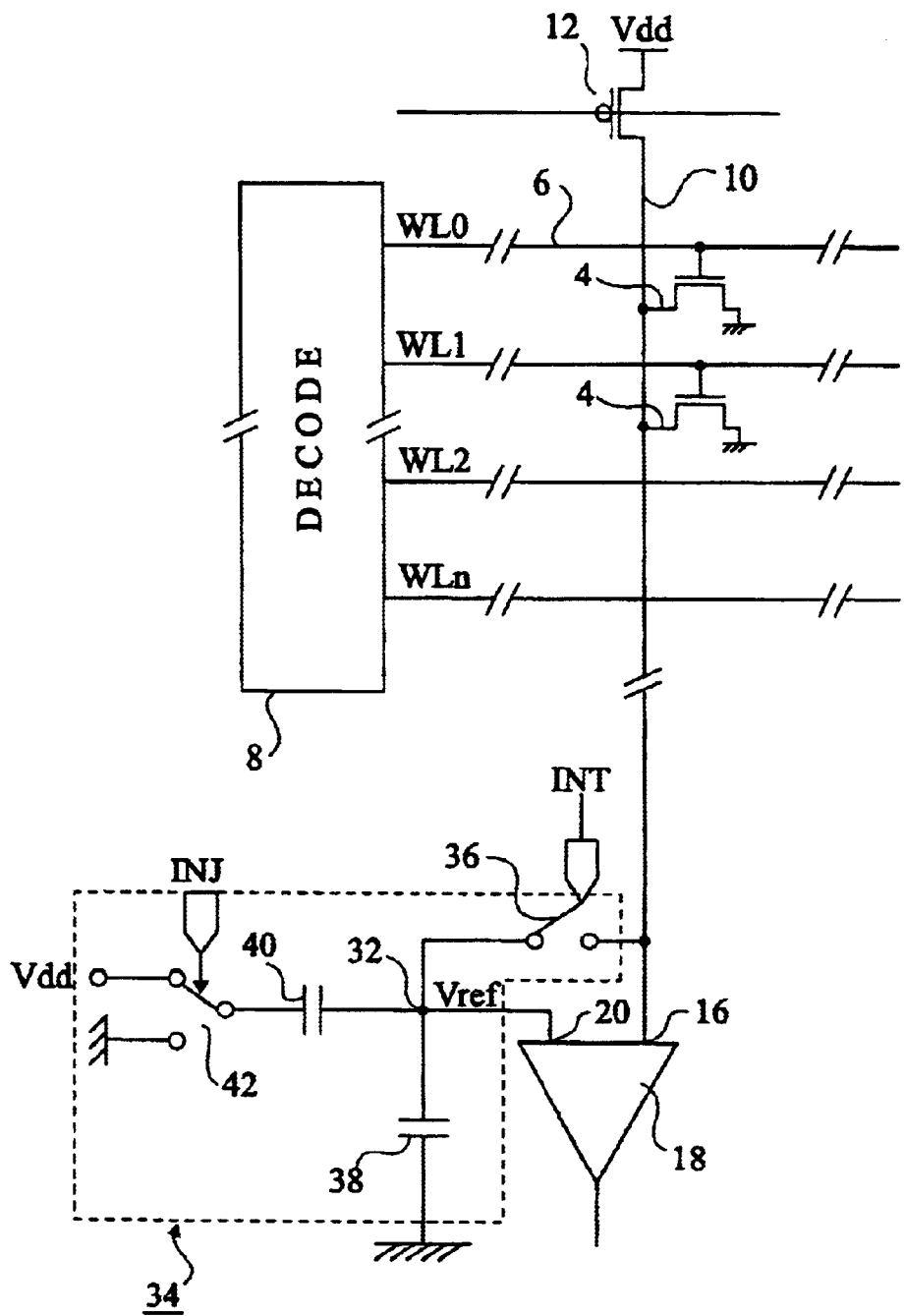
FIG. 2 schematically shows a column of a ROM connected to a reading device according to the present invention.

FIG. 2 illustrates a single column or bit line 10 of a ROM connected to a reading device according to the present invention. Column 10 is associated with several cells 4 and is connected to a high supply voltage Vdd via a precharge transistor 12. The state of a cell 4 (programmed or unprogrammed) is read when row 6 corresponding to this cell is selected by line decoder 8. A terminal of column 10 is connected to a first input 16 of a differential amplifier 18. A second input 20 of amplifier 18 is connected to a node 32 of a circuit 34 intended to provide a reference voltage Vref. Node 32 is connected to column 10 via a switch 36 controlled by binary signal INT. Node 32 is connected to ground by a first capacitive element 38. Node 32 is connected to the first terminal of a second capacitive element 40, the second terminal of which can be connected to a first voltage V1 or to ground by a switch 42 controlled by a binary signal INJ.

Figure 3:
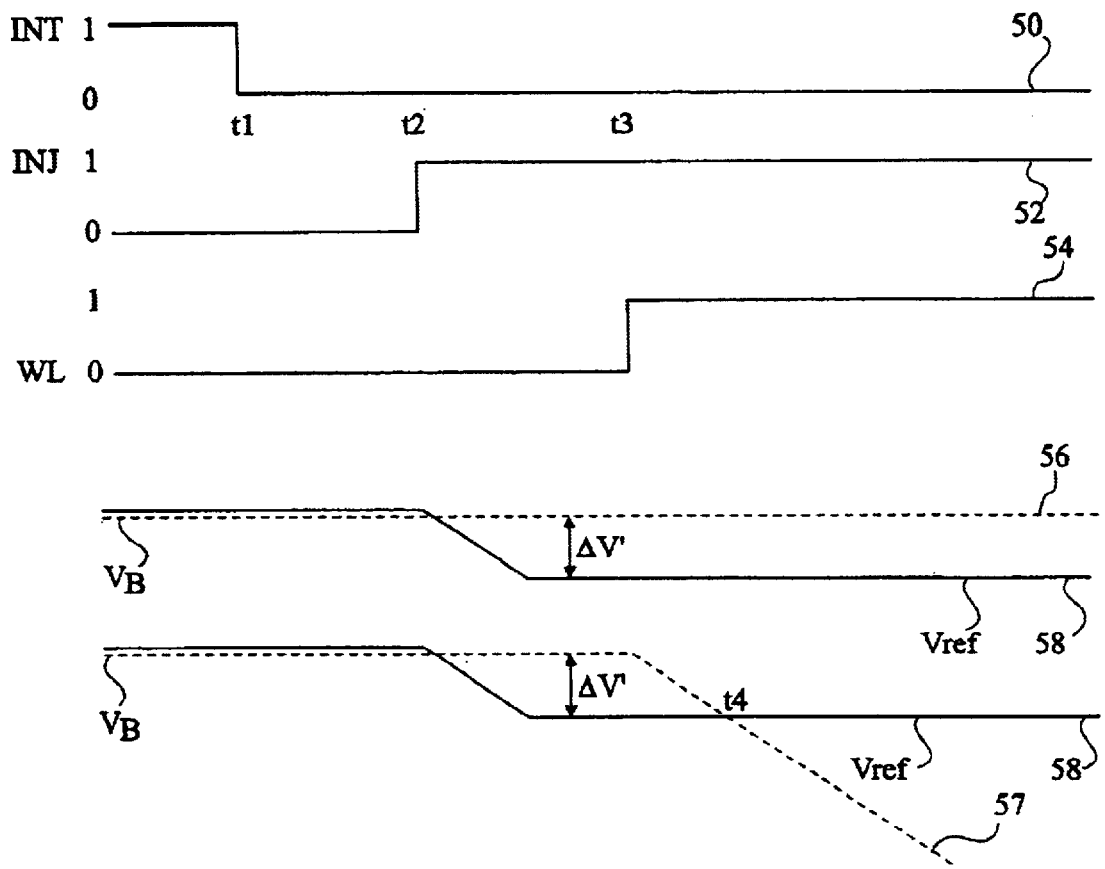
FIG. 3 is a timing diagram illustrating the method for reading a ROM according to the present invention.

FIG. 3 illustrates the operation of the reading device according to the present invention. Curve 50 represents signal INT, curve 52 represents signal INJ, curve 54 represents the signal of word line WL, curve 56 represents the voltage of an unprogrammed memory point (no active cell), curve 57 represents the voltage of a programmed memory point (presence of an active cell), and curve 58 represents reference voltage Vref generated by circuit 34 at input 20 of amplifier 18.

Initially, column 10 is connected by means of precharge transistor 12 to supply voltage Vdd and takes a voltage Vpch close to voltage Vdd, which depends on the memory structure.

At a time t1 at which a reading is desired to be performed, signal INT is switched from logic state "1" to logic state "0" to turn off switch 36 which was initially on. Node 32 then remains at the voltage of line 10.

At a time t2, binary signal INJ is switched from logic state "0" to logic state "1". This results in switching switch 42 and in connecting the second terminal of capacitive element 40 to ground (Vss). The two capacitive elements then are in parallel and the distribution of the charge stored on capacitive elements 38 and 40 is modified. Calling C1, C2 the values of the capacitances of capacitive elements 38, 40, and considering, for simplification, that Vss is equal to 0:

charge Q1 initially stored on capacitive element 38 is equal to C1.Vpch, charge Q2 initially stored on capacitive element 40 is equal to C2(Vpch−V1); the total charge thus is Q=(C1+C2)Vpch−C2.V1 after turning on of switch 42, the charge on capacitors 38 and 40 and Q becomes equal to (C1+C2)Vref.

Thus, Vref=Vpch−V1.C2/(C1+C2).

It may for example be chosen to have V1=Vdd or V1=Vpch and the reference voltage will be a reduced voltage with respect to Vpch, for example, linked to Vpch by a constant coefficient equal to C1/(C1+C2). The reference voltage is thus defined in a very precise manner with respect to the precharge voltage on line 10. A reference voltage very close to the precharge voltage can thus be chosen. It should be noted that other subtractor or divider circuits may be provided by those skilled in the art to provide a reference voltage linked to a stored precharge voltage.

At a time t3, binary read signal WL is switched from logic state "0" to logic state "1". If the considered memory point is not programmed, the voltage of line 10 at point 16 remains at its initial precharge level, illustrated by curve 56, or very slowly drops with respect to this level. If the considered memory point is programmed, column 10 discharges. At a time t4, the voltage of line 10, illustrated by curve 57, becomes smaller than Vref and the reading is performed. Due to the fact that Vref is only slightly smaller than Vpch, duration t3–t4 is particularly short.

In an embodiment, the first and second capacitive elements 38, 40 may be NMOS transistor capacitances, for example, gate-substrate capacitances of transistors having their drain, their source, and their substrate connected to ground.

Those skilled in the art may provide various alternative to the present invention, provided that the storage of the voltage of a ROM column just before a reading and the use of a fraction of this voltage as a read reference voltage are provided. Further, although the present invention has been described in relation with a memory for which the voltage of a column is likely to decrease, it will also apply to the case of a memory of which the voltage of a column is likely to increase. The reference voltage will then be increased with respect to the normal voltage of a column.

As an alternative, it should be noted that the mutual synchronizations of signals WL, INT, and INJ may be modified. Preferably, INJ will be delayed with respect to INT by an inverter. WL may be switched after, at the same time as, or little before INT.

Although the present invention has been described in the context of ROMs, it should be noted that it generally applies to any memory in which each cell is associated with a single read column.

In the described embodiment, the columns are associated with precharge transistors 12 with a common control. Separate controls may be provided for each precharge transistor or for subsets of precharge transistors. This enables reducing the consumption for each reading.

What is claimed is:

1. A device for reading a cell (4) of a memory, comprising:
 a differential sense amplifier (18) having a first input terminal (16) connected to a cell column (10); and
 a circuit (34) for providing to a second input terminal (20) of the amplifier (18) a reference voltage (Vref), wherein said circuit (34) comprises:
  a first means (38) for storing the voltage of said column; and
  a second means (40, 42) for applying as the reference voltage (Vref) the stored voltage modified by a predetermined amount.

2. The device of claim 1, wherein the presence of a cell translates as a reduction in the voltage of a column wherein the reference voltage is reduced by a predetermined amount with respect to the stored voltage.

3. The device of claim 1, wherein said first means is a first capacitive element (38) for storing a precharge voltage (Vpch) and the second means is a second capacitive element (40) connectable in parallel with the first capacitor to set the value of the reference voltage (Vref).

4. The device of claim 3, wherein the capacitive elements are formed of the gate-source, gate-substrate, and gate-drain capacitances of MOS transistors.

5. The device of claim 1, wherein each column is associated with a precharge transistor (12), wherein the precharge transistors are addressable independently.

6. A method for reading a cell (4) of a memory, comprising the steps of:
 storing the voltage of a column just before reading; and
 modifying the stored voltage by a predetermined amount and using the modified voltage as a reference voltage.

7. The method of claim 6, further comprising the step of comparing the reference voltage with a column voltage.

8. The method of claim 6, further comprising the steps of:
 applying a precharge voltage (Vpch) on a first capacitor (38);
 disconnecting the first capacitor from the precharge voltage; and
 connecting in parallel with the first capacitor a second capacitor (40).

* * * * *